United States Patent
Tuttle et al.

(10) Patent No.: US 7,053,294 B2
(45) Date of Patent: May 30, 2006

(54) THIN-FILM SOLAR CELL FABRICATED ON A FLEXIBLE METALLIC SUBSTRATE

(75) Inventors: John R. Tuttle, Frisco, CO (US); Rommel Noufi, Golden, CO (US); Falah S. Hasoon, Arvada, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/480,880

(22) PCT Filed: Jul. 13, 2001

(86) PCT No.: PCT/US01/22192

§ 371 (c)(1),
(2), (4) Date: Dec. 12, 2003

(87) PCT Pub. No.: WO03/007386

PCT Pub. Date: Jan. 23, 2003

(65) Prior Publication Data

US 2005/0074915 A1    Apr. 7, 2005

(51) Int. Cl.
*H01L 31/336*    (2006.01)
*H01L 31/392*    (2006.01)

(52) U.S. Cl. .................. 136/265; 136/256; 136/252; 136/264; 136/245; 136/244; 438/94; 438/95; 438/98; 257/431; 257/461; 257/464

(58) Field of Classification Search ............ 136/256, 136/262, 265, 264, 245, 252, 244; 438/94, 438/95, 98; 257/431, 461, 464
See application file for complete search history.

(56) References Cited

U.S. PATENT DOCUMENTS 3,586,541 A * 6/1971 Chamberlin ............... 136/206
4,191,794 A * 3/1980 Shirland et al. ............. 438/80

(Continued)

FOREIGN PATENT DOCUMENTS

DE        2741954 A1 *  3/1979

(Continued)

OTHER PUBLICATIONS

Gabor et al, "Band-gap engineering in Cu(In,Ga)Se2 thin films grown from (InGa)2Se3 precursors," Solar Energy Materials and Solar Cells, vol. 41/42, pp. 247-260, (1996).*

(Continued)

*Primary Examiner*—Alan Diamond
(74) *Attorney, Agent, or Firm*—Paul J. White

(57) ABSTRACT

A thin-film solar cell (10) is provided. The thin-film solar cell (10) comprises a flexible metallic substrate (12) having a first surface and a second surface. A back metal contact layer (16) is deposited on the first surface of the flexible metallic substrate (12). A semiconductor absorber layer (14) is deposited on the back metal contact. A photoactive film deposited on the semiconductor absorber layer (14) forms a heterojunction structure and a grid contact (24) deposited on the heterjunction structure. The flexible metal substrate (12) can be constructed of either aluminium or stainless steel. Furthermore, a method of constructing a solar cell is provided. The method comprises providing an aluminum substrate (12), depositing a semiconductor absorber layer (14) on the aluminum substrate (12), and insulating the aluminum substrate (12) from the semiconductor absorber layer (14) to inhibit reaction between the aluminum substrate (12) and the semiconductor absorber layer (14).

33 Claims, 3 Drawing Sheets

U.S. PATENT DOCUMENTS

| | | | |
|---|---|---|---|
| 4,192,721 A | | 3/1980 | Fawcett et al. |
| 4,404,422 A | * | 9/1983 | Green et al. ................. 136/255 |
| 4,522,663 A | * | 6/1985 | Ovshinsky et al. ......... 148/403 |
| 4,536,607 A | * | 8/1985 | Wiesmann ................. 136/249 |
| 4,622,432 A | | 11/1986 | Yamazaki |
| 4,642,140 A | | 2/1987 | Noufi et al. |
| 4,677,250 A | * | 6/1987 | Barnett et al. .............. 136/258 |
| 4,806,436 A | * | 2/1989 | Tada et al. .................. 428/629 |
| 5,078,804 A | * | 1/1992 | Chen et al. ................. 136/260 |
| 5,141,564 A | * | 8/1992 | Chen et al. ................. 136/258 |
| 5,244,509 A | | 9/1993 | Arao et al. |
| 5,277,786 A | | 1/1994 | Kawakami |
| 5,286,306 A | * | 2/1994 | Menezes ..................... 136/249 |
| 5,356,839 A | * | 10/1994 | Tuttle et al. ................. 438/479 |
| 5,401,573 A | * | 3/1995 | Babel et al. ................. 428/336 |
| 5,436,204 A | | 7/1995 | Albin et al. |
| 5,441,897 A | | 8/1995 | Noufi et al. |
| 5,633,033 A | | 5/1997 | Nishitani et al. |
| 5,677,250 A | * | 10/1997 | Knapp ......................... 501/14 |
| 5,728,231 A | | 3/1998 | Negami et al. |
| 5,730,852 A | * | 3/1998 | Bhattacharya et al. ...... 205/192 |
| 5,925,228 A | * | 7/1999 | Panitz et al. ................. 204/484 |
| 5,994,163 A | * | 11/1999 | Bodegard et al. ............. 438/84 |
| 6,121,541 A | * | 9/2000 | Arya ........................... 136/255 |
| 6,124,039 A | * | 9/2000 | Goetz et al. ................. 428/457 |

FOREIGN PATENT DOCUMENTS

| | | |
|---|---|---|
| EP | 0 7793 277 A2 | 2/1997 |
| EP | 0 7793 277 A3 | 9/1997 |
| EP | 793277 A2 * | 9/1997 |
| JP | 62-89369 A * | 4/1987 |
| JP | 63-249379 A * | 10/1988 |

OTHER PUBLICATIONS

Hermann et al, "Deposition of smooth Cu(In,Ga)Se2 films from Binary multilayers," Thin Solid Films, vol. 361-362, pp. 74-78, May 19, 2000.*

Hartmann et al, "Flexible and light weight substrates for Cu(In,Ga)Se2 solar cells and modules," IEEE, 2000, pp. 638-641.*

Batchelor et al, "Substrate and back contact effects in CIGS devices on steel foil," IEEE, 2002, pp. 716-719.*

Neelkanth e a, "AFM, micro-pl, and pv analyses of CuIn1-xGaS2 thin films solar cells on stainless steel foil," IEEE, 2002, pp. 876-879.*

PCT International Search Report, PCT/US01/22192, May 15, 2002.

Nakada, T. et al., "Superstrate-Type CuInSe2 Thin Film Solar Cells with Selenide Buffer Layers," 25th PVSC; May 13-17, 1996, Washington, DC., pp. 893-896.

* cited by examiner

THIN-FILM SOLAR CELL FABRICATED ON A FLEXIBLE METALLIC SUBSTRATE

CONTRACTUAL ORIGIN OF THE INVENTION

The United States Government has rights in this invention under Contract No. DE-AC36-99GO10337 between the United States Department of Energy and the National Renewable Energy Laboratory, a division of the Midwest Research Institute.

TECHNICAL FIELD

This invention relates generally to a thin-film solar cell and, more particularly, to a thin-film solar cell fabricated on a flexible metallic aluminum or stainless steel substrate with appropriate means for inhibiting reaction between the aluminum substrate and the semiconductor absorber.

BACKGROUND ART

Photovoltaic devices, i.e., solar cells, are capable of converting solar radiation into usable electrical energy. The energy conversion occurs as the result of what is known as the photovoltaic effect. Solar radiation impinging on a solar cell and absorbed by an active region of semiconductor material generates electricity.

In recent years, technologies relating to thin-film solar cells have been advanced to realize inexpensive and lightweight solar cells and, therefore, thinner solar cells manufactured with less material have been demanded. This is especially true in the space industry with the solar cells powering satellites and other space vehicles.

The current state of the art in solar cell design is to deposit a photoactive material onto a dense substrate. Typically, the substrate was constructed of glass or a low expansion glass ceramic with densities of approximately 2.2 gms/cc (2200 mg/cc) or higher. Accordingly, the weight of an array or battery of such prior art solar cells is a determining factor in the size of the battery system to be launched into space due to payload weight constraints. Heavy solar cells increase the cost of positioning the satellite into orbit and the operating costs by reducing the payload of the satellite and increasing the launch weight. A lighter weight cell substrate would provide savings in size and weight thereby translating into an increased size for satellite photovoltaic energy systems, which implies higher reliability and accessibility of the satellite throughout its life cycle.

Accordingly, there exists a need for a thin-film solar cell fabricated on a flexible metallic substrate which is inexpensive to manufacture. Additionally, a need exists for a thin-film solar cell fabricated on a flexible metallic substrate which is lightweight and reliable for use in space vehicles and other applications. Furthermore, there exists a need for a thin-film solar cell fabricated on a flexible metallic substrate wherein the flexible metallic substrate is an aluminum substrate or a stainless steel substrate with appropriate means between the aluminum substrate and the semiconductor absorber for inhibiting reaction between the aluminum substrate and the semiconductor absorber.

DISCLOSURE OF INVENTION

The present invention is a thin-film solar cell comprising a flexible metallic substrate, either aluminum or stainless steel, having a first surface and a second surface. A back metal contact layer is deposited on the first surface of the flexible metallic substrate. A semiconductor absorber layer is deposited on the back metal contact layer. A photoactive film is deposited on the semiconductor absorber layer forming a heterojunction structure. A grid contact is deposited on the heterojunction structure.

The present invention additionally includes a solar cell for converting solar radiation into usable electrical energy. The solar cell comprises an aluminum substrate and a semiconductor absorber. Means between the aluminum substrate and the semiconductor absorber inhibit reaction between the aluminum substrate and the semiconductor absorber.

The present invention further includes a method of constructing a solar cell. The method comprises providing an aluminum substrate, depositing a semiconductor absorber layer on the aluminum substrate, and insulating the aluminum substrate from the semiconductor absorber layer to inhibit reaction between the aluminum substrate and the semiconductor absorber layer.

BRIEF DESCRIPTION OF DRAWINGS

The accompanying drawings, which are incorporated in and form a part of the specification, illustrate the preferred embodiments of the present invention, and together with the descriptions serve to explain the principles of the invention.

In the Drawings.

DETAILED DESCRIPTION OF THE PREFERRED EMBODIMENTS

Figure 1:
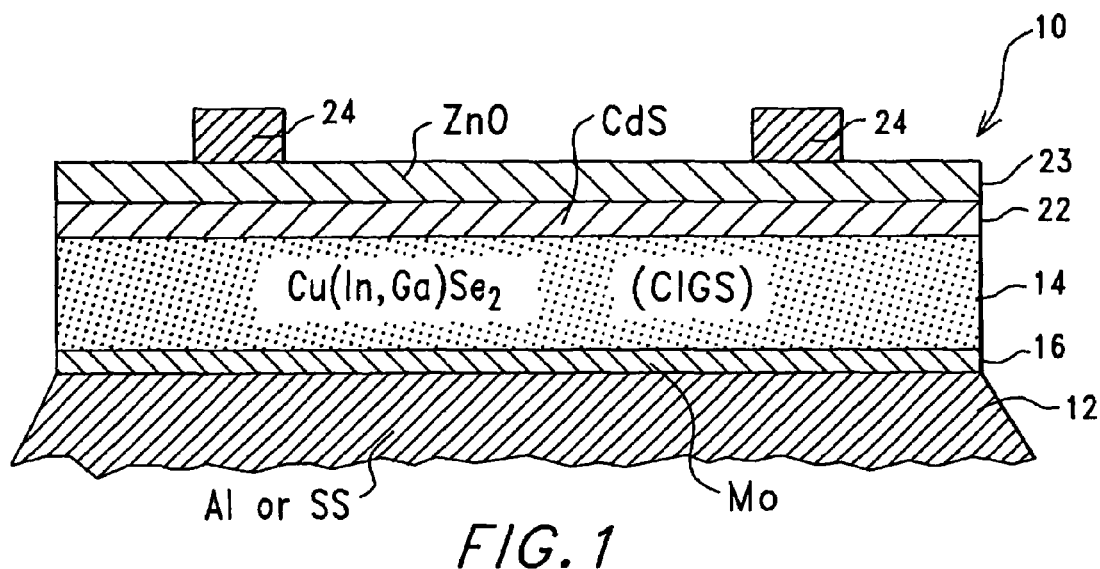
FIG. 1 is a sectional view of a thin-film solar cell fabricated on a flexible metallic substrate, constructed in accordance with the present invention.

As illustrated in FIG. 1, the present invention is a thin-film solar cell, indicated generally at 10. The thin-film solar 10 cell has a flexible metallic substrate 12 preferably constructed from an Aluminum (Al) material or a stainless steel material and a semiconductor absorber layer 14 deposited on the flexible metallic substrate 12. The surface of the flexible metallic substrate 12 can be polished (to benefit the film structure of the absorber layer 14 and morphology) or it may be textured (to increase the path length of the reflected light). A chromium adhesion layer, although not always required, can be added to increase adhesion, i.e., a chromium adhesion layer between approximately 100 Å and 400 Å. Furthermore, the flexible metallic substrate 12 can be thin and flexible, i.e., approximately 25 μm to approximately 100 μm, in order that the thin-film solar cell 10 is lightweight, or the flexible metallic substrate 12 can be thick and rigid to improve handling of the thin-film solar cell 10.

In an embodiment of the present invention, the semiconductor absorber layer 14 is a deposition of high quality Cu(In, Ga)Se$_2$ (CIGS) thin films providing the fabrication of a high efficiency thin-film solar cell 10. Example processes of deposition of the semiconductor absorber layer 14 are described in U.S. Pat. No. 5,436,204 and U.S. Pat. No. 5,441,897, which are assigned to the same assignee of the present application and are hereby herein incorporated by reference. It should be noted that the deposition of the CIGS thin film 14 onto the flexible metallic substrate 12 can be by any of a variety of common techniques including, but not limited to, evaporation, sputtering electrodeposition, chemical vapor deposition, etc.

While the deposition of the CIGS thin film 14 has been demonstrated before on other metal foil substrates such as Titanium and Molybdenum, the fundamental hurdle for the deposition of CIGS thin films 14 onto the Aluminum substrate 12 is that the Aluminum in the Aluminum substrate 12 reacts with the Selenium in the CIGS thin film 14 to form $Al_2Se_3$ (an unstable compound in air). Furthermore, at high temperatures, the Aluminum within the Aluminum substrate 12 alloys with the Copper, Indium, and Gallium in the CIGS thin film 14. With the reaction between the Aluminum and the Copper and the alloy of Aluminum with the Copper, Indium, and Gallium, the Aluminum substrate 12 would be essentially consumed during the deposition of the CIGS thin film 14 on the Aluminum substrate 12. A requirement for a properly functioning thin-film solar cell 10 is that the substrate be inert to the film deposited on the substrate.

In order to overcome the consumption of the Aluminum substrate 12 with the CIGS thin film 14 during deposition of the CIGS thin film 14 onto the Aluminum substrate 12, the inventors of the present application discovered that a layer of suitable back metal contact (i.e., conductive metal layer) 16 can be deposited on one or both surfaces of the Aluminum substrate 12 between the Aluminum substrate 12 and the CIGS thin film 14. The back metal contact layer 16 protects and isolates the Aluminum substrate 12 from the fluxes of the Selenium in the CIGS thin film 14 during the deposition of the CIGS thin film 14 onto the Aluminum substrate 12. Preferably, the back metal contact layer 16 is constructed from a Molybdenum (Mo) material. The Molybdenum back metal contact layer 16 preferably has a thickness between approximately 0.1 μm and approximately 1.0 μm although having a Molybdenum back metal contact layer 16 with a thickness less than approximately 0.1 μm and greater than approximately 1.0 μm is within the scope of the present invention. Furthermore, it should be noted that other back metal contact layers 16 besides a Molybdenum back metal contact layer 16 can be used including, but not limited to, a molybdenum/gold combination, nickel, graphite, etc., (all which have been commonly employed in conventional solar cells).

Figure 2:
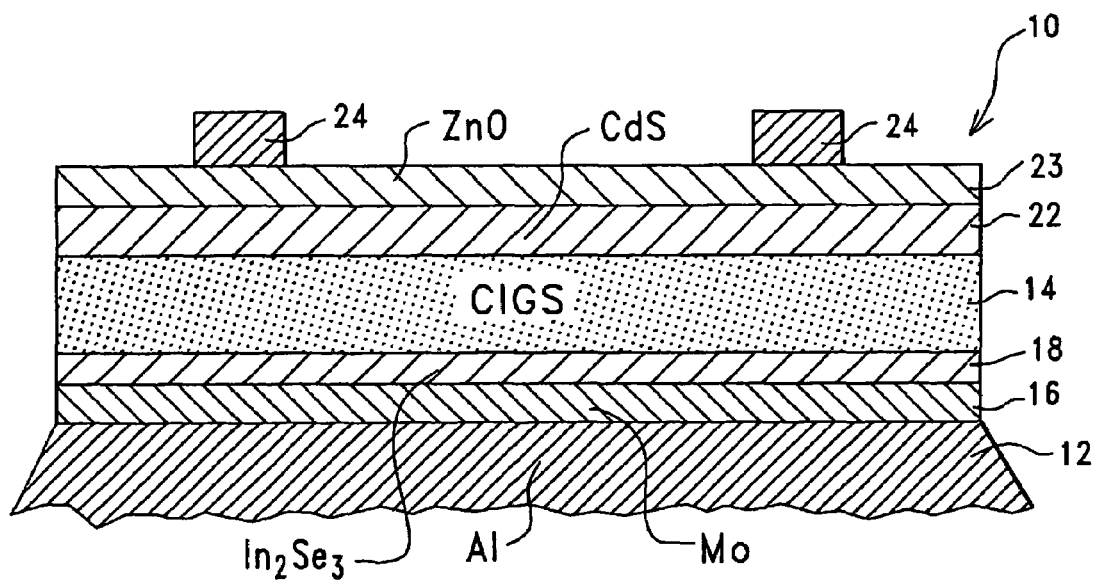
FIG. 2 is a sectional view of another embodiment of the thin-film solar cell fabricated on a flexible metallic substrate, constructed in accordance with the present invention.

In addition, as illustrated in FIG. 2, when depositing the CIGS thin film 14, a seed layer 18 of In2Se3 or (In,Ga)2Se3 can be deposited on the Molybdenum back metal contact layer 16 which also adds protection of the Aluminum substrate 12 from the CIGS thin film 14. The seed layer 18 of In2Se3 is then followed by the CIGS thin film 14 deposition scheme as described in U.S. Pat. No. 5,436,204 and U.S. Pat. No. 5,441,897, for instance. While the Molybdenum back metal contact layer 14 is sufficient to protect the Aluminum substrate 12, the In2Se3 seed layer 18 is an added protection at the start of the CIGS thin film 16 deposition, but will end up reacting with the Copper, Indium, Gallium, and Selenium fluxes during the CIGS thin film 14 growth, and is accounted for in the final CIGS thin film 14 composition.

Figure 3:
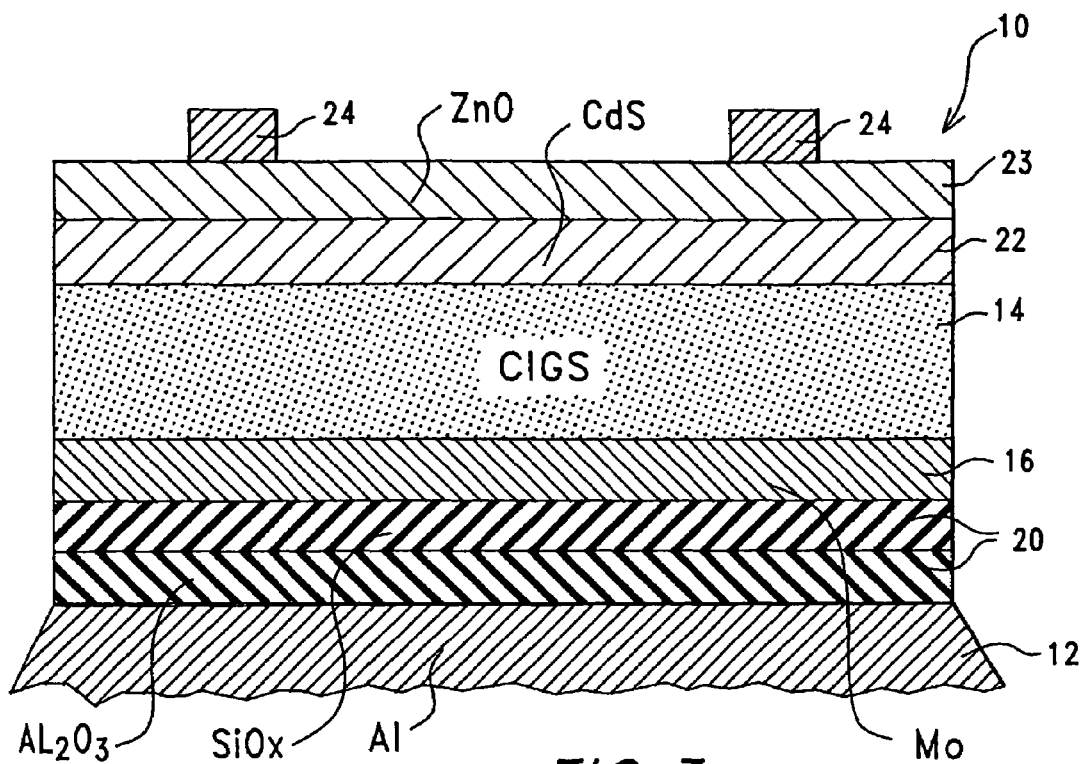
FIG. 3 is a sectional view of still another embodiment of the thin-film solar cell fabricated on a flexible metallic substrate, constructed in accordance with the present invention.
Figure 4:
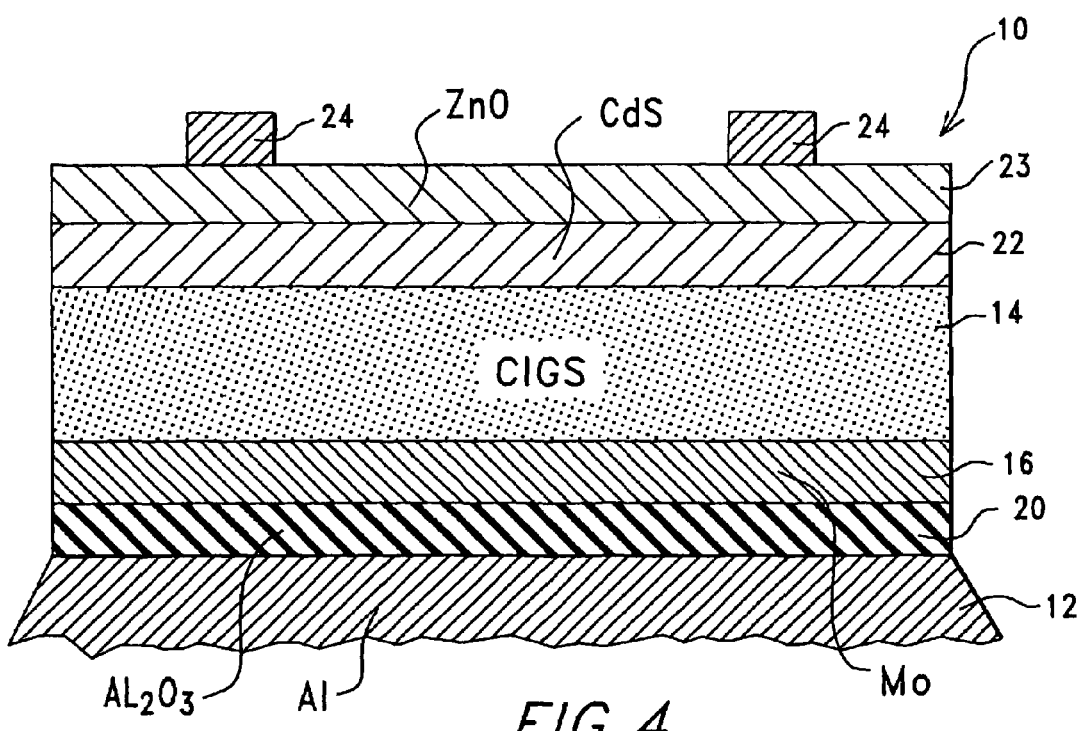
FIG. 4 is a sectional view of yet another embodiment of the thin-film solar cell fabricated on a flexible metallic substrate, constructed in accordance with the present invention.
Figure 5:
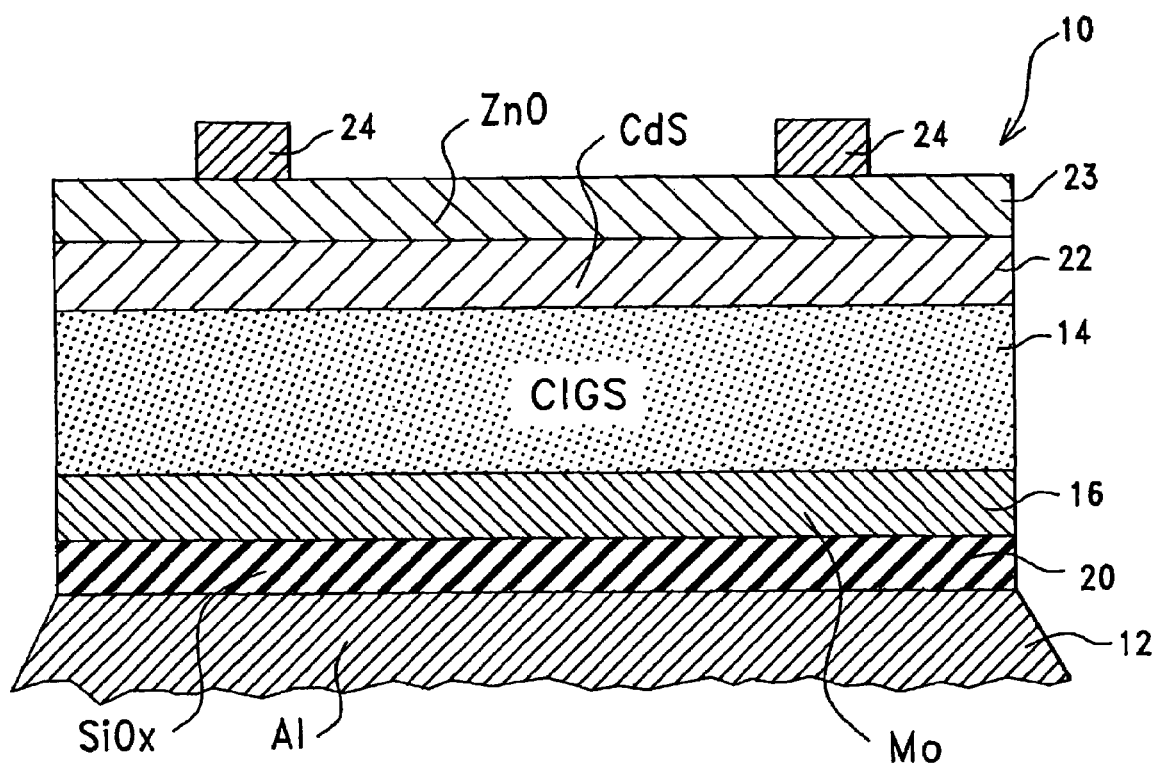
FIG. 5 is a sectional view of still yet another embodiment of the thin-film solar cell fabricated on a flexible metallic substrate, constructed in accordance with the present invention.

In a variation of the above-described CIGS thin film 14 deposition scheme, as illustrated in FIGS. 3, 4, and 5, an insulation layer 20 of one or more oxides of silicon ($SiO_x$), and/or $Al_2O_3$ (preferred) can be deposited on the Aluminum substrate 12 followed by the Molybdenum back metal contact layer 16. The insulation layer 20 serves as an additional protection for the Aluminum substrate 12 with the Molybdenum back contact layer 16. The primary function, however, of the thin insulation layer 20 is to allow the use of CIGS thin films 14 on the Aluminum substrates 12, in monolithically integrated modules, based on CIGS solar cells. In this configuration, the Aluminum substrate 12 must be electrically isolated from the Molybdenum back metal contact layer 16 in order to accomplish the monolithic interconnect of individual solar cells into a module. In monolithic interconnect CIGS modules, the Aluminum substrate 12 serves as the substrate and the one or more oxides of silicon ($SiO_x$), and/or $Al_2O_3$ insulation layer 20 serves as an electric isolation between the Aluminum substrate 12 and the Molybdenum back metal contact layer 16. The Molybdenum back contact metal layer is the back contact and the CIGS thin film 14 is the absorber.

Therefore, the thin-film solar cell 10 of the present invention can be constructed in at least the following two variations:

1. Al/Mo/CIGS/CdS/ZnO. This structure is for a single, stand-alone thin-film solar cell 10.
2. Al/($Al_2O_3$ and/or $SiO_x$)/Mo/CIGS/CdS/ZnO)). This structure is necessary for monolithic interconnected modules made up of several thin-film solar cells 10 and can be used for the single, stand-alone thin-film solar cell 10.

In yet another embodiment of the thin-film solar cell 10 of the present invention, the $Al_2O_3$ insulation layer 20 can be deposited on the Aluminum substrate 12 by any of a variety of common techniques including, but not limited to, evaporation, sputtering electrodeposition, chemical vapor deposition, etc. In still another embodiment of the thin-film solar cell 10, the $Al_2O_3$ insulation layer 20 can be constructed by anodizing the Aluminum substrate 12. The anodization essentially converts the surfaces of the Aluminum substrate 12 to $Al_2O_3$ by electrolytic means. It should be noted that in this embodiment, the adhesion layer between the Aluminum substrate 12 and alumina, as described above, is not necessary.

To complete the construction of the thin-film solar cell 10, the CIGS can be paired with a II–VI film 22 to form a photoactive heterojunction. In an embodiment of the present invention, the II–VI film 22 is constructed from Cadmium Sulfide (CdS) although constructing the II–VI films 22 from other materials including, but not limited to, Cadmium Zinc Sulfide (CdZnS), Zinc Selenide (ZnSe), etc., are within the scope of the present invention.

A transparent conducting oxide (TCO) layer 23 for collection of current is applied to the II–VI film. Preferably, the transparent conducting oxide layer 23 is constructed from Zinc Oxide (ZnO) although constructing the transparent conducting oxide layer 23 from other materials is within the scope of the present invention.

A suitable grid contact 24 or other suitable collector is deposited on the upper surface of the TCO layer 23 when forming a stand-alone thin-film solar cell 10. The grid contact 24 can be formed from various materials but should have high electrical conductivity and form a good ohmic contact with the underlying TCO 23. In an embodiment of the present invention, the grid contact 24 is constructed from a metal material, although constructing the grid contact 24 from other materials including, but not limited to, aluminum, indium, chromium, or molybdenum, with an additional conductive metal overlayment, such as copper, silver, nickel, etc., is within the scope of the present invention.

Furthermore, one or more anti-reflective coatings (not shown) can be applied to the grid contact 24 to improve the thin-film solar cell's 10 collection of incident light. As understood by a person skilled in the art, any suitable anti-reflective coating is within the scope of the present invention.

The thin-film solar cell 10 is singular in nature and has variable size, ranging from approximately 1-cm$^2$ to approximately 100-cm$^2$ or even larger. In order to series connect singular thin-film solar cells 10, the thin-film solar cells 10 must be separated by cutting or slitting the flexible metallic substrate 12 and then reconnecting the grid contact 24 of one thin-film solar cell 10 to the flexible metallic substrate 12 of another thin-film solar cell 10. In the monolithic integration, the monolithic integrated scheme can be followed to connect the thin-film solar cells 10.

The thin-film solar cell 10 of the present invention provides a great advantage over conventional solar cells. The thin-film solar cell 10 with the flexible metallic substrate 12, as described herein, is lighter, less space consuming, and less expensive than using glass or other metallic substrates. Lightness and size are especially useful in space applications where these criteria are important factors. Furthermore, the thin-film solar cell 10 of the present invention can be rolled and/or folded, depending on the desires of the user.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

The embodiments of the invention in which an exclusive property or privilege is claimed are defined as follow:

1. A thin-film solar cell comprising:
   a flexible aluminum substrate having an anodized first surface;
   an electrically conductive back metal contact layer deposited on the anodized first surface of the flexible aluminum substrate wherein the anodized first surface electrically insulates the aluminum substrate from the electrically conductive back metal contact layer;
   a semiconductor absorber layer deposited on the back metal contact wherein the semiconductor absorber layer is constructed from a film selected from the group consisting of Cu(In,Ga)Se$_2$, CuInSe$_2$, CuGaSe$_2$, CuInS$_2$, and Cu(In,Ga)S$_2$;
   a photoactive film deposited on the semiconductor absorber layer forming a heterojunction structure; and
   a grid contact deposited on the heterojunction structure.

2. A monolithically integrated module comprising a plurality of the thin-film solar cells of claim 1.

3. The monolithically integrated module of claim 2 wherein the anodized first surface electrically isolates the aluminum substrate from the back metal contact layer of each of the plurality of thin-film solar cells to thereby allow for interconnection of the solar cells.

4. The thin-film solar cell of claim 1 wherein the back metal contact is constructed from a Molybdenum (Mo) material.

5. The thin-film solar cell of claim 4 wherein the Molybdenum material has a thickness between approximately 0.1 µm and approximately 1.0 µm.

6. The thin-film solar cell of claim 1 wherein the aluminum substrate comprises an anodized second surface.

7. The thin-film solar cell of claim 1 wherein the photoactive film is constructed from Cadmium Sulfide (CdS).

8. The thin-film solar cell of claim 1 and further comprising:
   a transparent conducting oxide for collecting current.

9. The thin-film solar cell of claim 1 wherein the grid contact is constructed from metal.

10. The thin-film solar cell of claim 1 and further comprising:
    an (In,Ga)$_2$Se$_3$ layer deposited between the back metal contact layer and the semiconductor absorber layer.

11. The thin-film solar cell of claim 1 wherein the anodized first surface comprises Al$_2$O$_3$ formed by anodizing the substrate.

12. The thin-film solar cell of claim 1 and further comprising:
    an insulation layer of one or more oxides of silicon, deposited on the anodized first surface.

13. The thin-film solar cell of claim 1 and further comprising:
    an insulation layer of one or more oxides of silicon, deposited between the substrate and the back metal contact layer.

14. The thin-film solar cell of claim 1 wherein at least the anodized first surface of the aluminum substrate is anodized thereby forming Al$_2$O$_3$.

15. The thin-film solar cell of claim 6 wherein the anodized second surface of the aluminum substrate is anodized thereby forming Al$_2$O$_3$.

16. The thin-film solar cell of claim 6 wherein the anodized second surface of the substrate is protected with one or more oxides of silicon.

17. A solar cell for converting solar radiation into usable electrical energy, the solar cell comprising:
    an aluminum substrate;
    a semiconductor absorber;
    an electrically conductive back metal contact layer between the substrate and the semiconductor absorber;
    Al$_2$O$_3$ between the substrate and the back metal contact layer, the Al$_2$O$_3$ formed by anodizing the aluminum substrate wherein the Al$_2$O$_3$ electrically insulates the aluminum substrate from the electrically conductive back metal contact layer; and
    an In$_2$Se$_3$ layer deposited between the back metal contact layer and the semiconductor absorber.

18. The solar cell of claim 17 wherein the semiconductor absorber is a Cu(In, Ga)Se$_2$ (CIGS) thin film.

19. The solar cell of claim 17 wherein the back metal contact layer comprises Molybdenum (Mo).

20. The solar cell of claim 17 wherein the anodizing occurs without use of an adhesion layer.

21. The solar cell of claim 17 and further comprising:
    an insulation layer of one or more oxides of silicon on the Al$_2$O$_3$ between the Al$_2$O$_3$ and the back contact layer.

22. A monolithically integrated module comprising a plurality of the solar cells of claim 17.

23. A method of constructing a thin-film solar cell, the method comprising:
provide an aluminum substrate;
depositing a Cu(In, Ga)Se$_2$ (CIGS) thin film semiconductor absorber layer on the aluminum substrate; and
insulating the aluminum substrate from the semiconductor absorber layer to inhibit reaction between the aluminum substrate and the semiconductor absorber layer wherein the insulating comprises anodizing a surface of the aluminum substrate to thereby form a layer of Al$_2$O$_3$ that insulates the aluminum substrate from the semiconductor absorber layer.

24. The method of claim 23 wherein the anodizing occurs without providing an adhesion layer.

25. The method of claim 23 wherein the aluminum substrate is insulated from the semiconductor absorber layer by a back metal contact layer.

26. The method of claim 23 and further comprising:
depositing an In$_2$Se$_3$ layer between the substrate and the semiconductor absorber layer.

27. The method of claim 25 and further comprising:
depositing an insulation layer of one or more oxides of silicon, on the layer of Al$_2$O$_3$ between the layer of Al$_2$O$_3$ and the back contact layer.

28. A thin-film solar cell comprising:
an aluminum substrate that comprises an electrically insulating layer of Al$_2$O$_3$ formed by anodizing the aluminum substrate;
a semiconductor absorber layer; and
an (In,Ga)$_2$Se$_3$ layer deposited between the substrate and the semiconductor absorber layer.

29. The thin-film solar cell of claim 28 further comprising a back metal contact layer between the substrate and the semiconductor absorber layer.

30. The thin-film solar cell of claim 29 wherein the (In,Ga)$_2$Se$_3$ layer is deposited on the back metal contact layer between the back metal contact layer and the semiconductor absorber layer.

31. A monolithically integrated module comprising a plurality of the thin-film solar cells of claim 28.

32. A method of constructing a thin-film solar cell, the method comprising:
providing an aluminum substrate that comprises an electrically insulating layer of Al$_2$O$_3$ formed by anodizing the aluminum substrate;
depositing an In$_2$Se$_3$ layer on a layer supported by the substrate; and
depositing a semiconductor absorber layer on the In$_2$Se$_3$ layer.

33. The method of claim 32 further comprising constructing a monolithically integrated module of a plurality of the thin-film solar cells.

* * * * *